(12) United States Patent
Yu et al.

(10) Patent No.: US 9,042,509 B2
(45) Date of Patent: May 26, 2015

(54) LIQUID CRYSTAL DISPLAY AND BIDIRECTIONAL SHIFT REGISTER DEVICE THEREOF

(71) Applicant: Hannstar Display Corporation, New Taipei (TW)

(72) Inventors: Chia-Hua Yu, New Taipei (TW); Chien-Ting Chan, Tainan (TW); Chien-Chuan Ko, Changhua County (TW); Chun-Lin Chang, Tainan (TW)

(73) Assignee: HannStar Display Corporation, Taipei (TW)

( * ) Notice: Subject to any disclaimer, the term of this patent is extended or adjusted under 35 U.S.C. 154(b) by 70 days.

(21) Appl. No.: 13/935,582

(22) Filed: Jul. 5, 2013

(65) Prior Publication Data

US 2014/0049712 A1 Feb. 20, 2014

(30) Foreign Application Priority Data

Aug. 17, 2012 (CN) .......................... 2012 1 0295804

(51) Int. Cl.
| | |
|---|---|
| G11C 19/00 | (2006.01) |
| G02F 1/133 | (2006.01) |
| G11C 19/28 | (2006.01) |
| G09G 3/36 | (2006.01) |

(52) U.S. Cl.
CPC ............ *G02F 1/13306* (2013.01); *G11C 19/28* (2013.01); *G09G 2310/0286* (2013.01); *G09G 3/3688* (2013.01); *G09G 2310/0283* (2013.01); *G09G 2310/0291* (2013.01)

(58) Field of Classification Search
None
See application file for complete search history.

(56) References Cited

U.S. PATENT DOCUMENTS

| | | | |
|---|---|---|---|
| 7,929,658 B2* | 4/2011 | Lin et al. .......................... | 377/64 |
| 8,265,222 B2* | 9/2012 | Jang ................................ | 377/64 |
| 8,456,200 B2* | 6/2013 | Sato et al. ....................... | 327/108 |
| 2009/0041177 A1* | 2/2009 | Chien et al. ..................... | 377/64 |
| 2010/0272228 A1* | 10/2010 | Hsiao et al. ..................... | 377/79 |
| 2011/0026665 A1* | 2/2011 | Chan et al. ...................... | 377/69 |
| 2011/0228893 A1* | 9/2011 | Tobita et al. .................... | 377/77 |
| 2012/0008731 A1* | 1/2012 | Hsu et al. ........................ | 377/79 |
| 2012/0146978 A1* | 6/2012 | Park et al. ....................... | 345/211 |
| 2012/0170707 A1* | 7/2012 | Hsu et al. ........................ | 377/79 |
| 2013/0083885 A1* | 4/2013 | Lee et al. ........................ | 377/69 |
| 2013/0222220 A1* | 8/2013 | Tobita ............................. | 345/100 |

* cited by examiner

*Primary Examiner* — Tuan T Lam
(74) *Attorney, Agent, or Firm* — Jianq Chyun IP Office

(57) ABSTRACT

An LCD and a bidirectional shift register device thereof are provided. The bidirectional shift register device of the invention is disposed on the substrate of the panel and includes multi-stages shift registers in series connection. Each stage shift register includes a pre-charging unit, a pull-up unit and a pull-down unit, in which the pre-charging unit receives a first preset clock signal and the output from a (i−1)th stage shift register or a (i+1)th stage shift register so as to thereby output a charging signal. The pull-up unit receives the charging signal and a second preset clock signal so as to thereby output a scan signal. The pull-down unit receives the second preset clock signal, a third preset clock signal and the output from the (i+2)th stage shift register or the (i−2)th stage shift register so as to decide whether or not pulling down the scan signal to a reference level.

12 Claims, 5 Drawing Sheets

LIQUID CRYSTAL DISPLAY AND BIDIRECTIONAL SHIFT REGISTER DEVICE THEREOF

CROSS-REFERENCE TO RELATED APPLICATION

This application claims the priority benefit of China application serial no. 201210295804.X, filed on Aug. 17, 2012. The entirety of the above-mentioned patent application is hereby incorporated by reference herein and made a part of this specification.

BACKGROUND OF THE INVENTION

1. Field of the Invention

The invention generally relates to a flat panel display technology, and more particularly, to a liquid crystal display (LCD) and a bidirectional shift register device thereof.

2. Description of Related Art

In recent years, with the vigorous development of semiconductor technology, the portable electronic products and flat panel display products also get rise. Among the many type of flat panel displays, LCD, based on its low-voltage operation, no radiation scattering, light weight and small size, has played a major role in the mainstream display market. Because of this, it drives various manufacturers for the development of LCD technology towards the direction of more miniaturization and low production costs.

In order to reduce the LCD production costs, some manufacturers have developed an LCD panel by using amorphous silicon (a-Si) process, wherein the shift registers originally disposed in the scan driver IC of the scan side of the LCD panel are relocated and directly disposed on the glass substrate of the LCD panel. As a result, the scan driver IC disposed at the scan side of the LCD panel can be saved so as to reduce the production costs of the LCD.

SUMMARY OF THE INVENTION

Accordingly, an exemplary embodiment of the invention provides a bidirectional shift register device, which includes N stages shift registers in series connection, in which the i-th stage shift register includes a pre-charging unit, a pull-up unit and a pull-down unit, and N is a preset positive integer and i is a positive integer greater than or equal to 3 but less than or equal to N−2. The pre-charging unit is for receiving a first preset clock signal and the output from a (i−1)th stage shift register or a (i+1)th stage shift register so as to thereby output a charging signal. The pull-up unit is coupled to the pre-charging unit for receiving the charging signal and a second preset clock signal so as to thereby output a scan signal. The pull-down unit is coupled to the pre-charging unit and the pull-up unit for receiving the second preset clock signal, a third preset clock signal and the output from the (i+2)th stage shift register or the (i−2)th stage shift register so as to decide whether or not pulling down the scan signal to a reference level.

In an exemplary embodiment of the present invention, the above-mentioned pre-charging unit of the i-th stage shift register includes a first transistor, a second transistor and a third transistor. The gate and drain of the first transistor are coupled to each other to receive the output from the (i−1)th stage shift register. The gate and drain of the second transistor are coupled to each other to receive the output from the (i+1)th stage shift register. The drain of the third transistor is coupled to the sources of the first transistor and the second transistor, the gate thereof is for receiving the first preset clock signal and the source thereof is for outputting the charging signal.

In an exemplary embodiment of the present invention, the above-mentioned pull-up unit of the i-th stage shift register includes a fourth transistor and a first capacitor. The drain of the fourth transistor is for receiving the second preset clock signal, the gate thereof is coupled to the source of the third transistor and the source thereof is for outputting the scan signal. The first capacitor is coupled between the gate and the source of the fourth transistor.

In an exemplary embodiment of the present invention, the above-mentioned pull-down unit of the i-th stage shift register includes a second capacitor and six transistors from fifth one to tenth one. The first terminal of the second capacitor receives the second preset clock signal. The drain of the fifth transistor is coupled to the second terminal of the second capacitor, the gate thereof is coupled to the source of the third transistor and the source thereof is coupled to the reference level. The drain of the sixth transistor is coupled to the source of the fourth transistor, the gate thereof is for receiving the third preset clock signal and the source thereof is coupled to the reference level. The drain of the seventh transistor is coupled to the source of the fourth transistor, the gate thereof is coupled to the drain of the fifth transistor and the source thereof is coupled to the reference level. The drain of the eighth transistor is coupled to the source of the third transistor, the gate thereof is coupled to the drain of the fifth transistor and the source thereof is coupled to the reference level. The drain of the ninth transistor is coupled to the source of the third transistor, the gate thereof is for receiving the output from the (i+2)th stage shift register and the source thereof is coupled to the reference level. The drain of the tenth transistor is coupled to the source of the third transistor, the gate thereof is coupled to the output from the (i−2)th stage shift register and the source thereof is coupled to the reference level.

In an exemplary embodiment of the present invention, the enabling time of the first through third preset clock signals are overlapped with each other.

In an exemplary embodiment of the present invention, the circuit configurations of the $1^{st}$ stage, $2^{nd}$ stage, (N−1)th stage and N-th stage shift registers are the same as that of the i-th stage shift register and all the four ones are dummy shift registers.

Another exemplary embodiment of the invention provides an LCD, which includes an LCD panel and a backlight module required by the LCD panel. The LCD panel includes a substrate and an above-mentioned bidirectional shift register device, in which the bidirectional shift register device is directly disposed on the substrate The above-mentioned depiction and the following detailed features are exemplary ones for further explaining, not to limit, the claim scope of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention, not to limit the claim scope of the invention.

DESCRIPTION OF THE EMBODIMENTS

Figure 1:
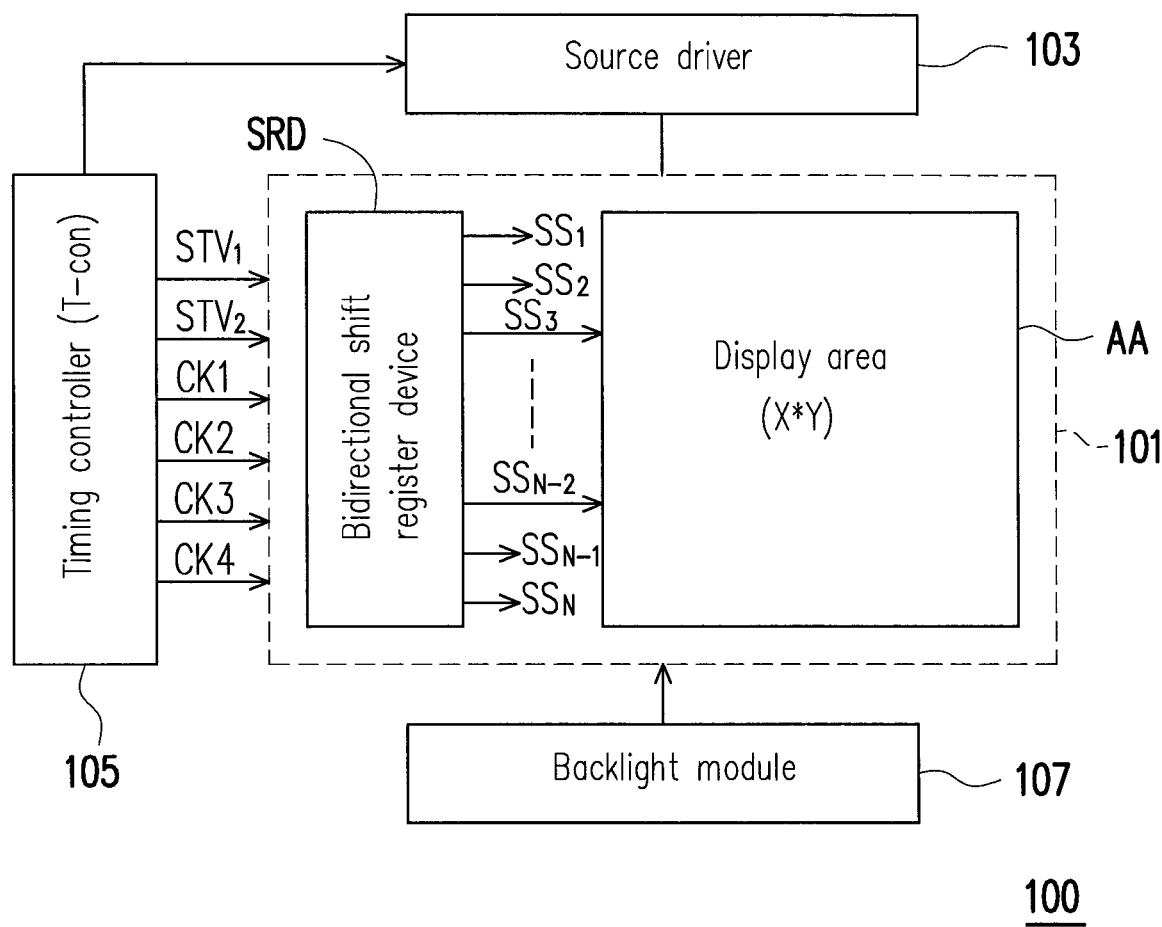
FIG. 1 is a system block chart of an LCD 100 according to an exemplary embodiment of the invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a system block chart of an LCD 100 according to an exemplary embodiment of the invention. Referring to FIG. 1, the LCD 100 includes an LCD panel 101, a source driver 103, a timing controller (T-con) 105 and a backlight module 107 configured for providing the LCD panel 101 with the required light source (backlight source).

In the exemplary embodiment, a display area AA of the LCD panel 101 has a plurality of pixels arranged in an array therein (indicated with X*Y, and X and Y are positive integers). In general, X*Y can also represent the resolution of the LCD 100, for example, 1024*768, which the invention is not limited to. In addition, a bidirectional (forward-directional-directional and reverse-directional-directional) shift register device SRD is directly disposed on a side of a substrate (not shown, for example, glass substrate).

Controlled by the T-con 105 and in response to starting signals $STV_1$ and $STV_2$ and clock signals CK1-CK4 provided by the T-con 105, the bidirectional shift register device SRD outputs in forward-directional (from up to down) and in series N scan signals $SS_1$-$SS_N$ (N=Y+4) so as to one-by-one turn on all of the pixel rows in the display area AA from the $1^{st}$ pixel row to the last pixel row (i.e., the bidirectional shift register device SRD performs the forward scanning on the display area AA) through the scan signals $SS_3$-$SS_{N-2}$ output in forward-directional and in series; or in response to the starting signals $STV_1$ and $STV_2$ and the clock signals $CK_1$-$CK_4$ provided by the T-con 105, the bidirectional shift register device SRD outputs in reverse-directional (from down to up) and in series N scan signals $SS_N$-$SS_1$ (N=Y+4) so as to one-by-one turn on all of the pixel rows in the display area AA from the last pixel row to the $1^{st}$ pixel row (i.e., the bidirectional shift register device SRD performs the reverse scanning on the display area AA) through the scan signals $SS_{N-2}$-$SS_3$ output in reverse-directional and in series.

Figure 2:
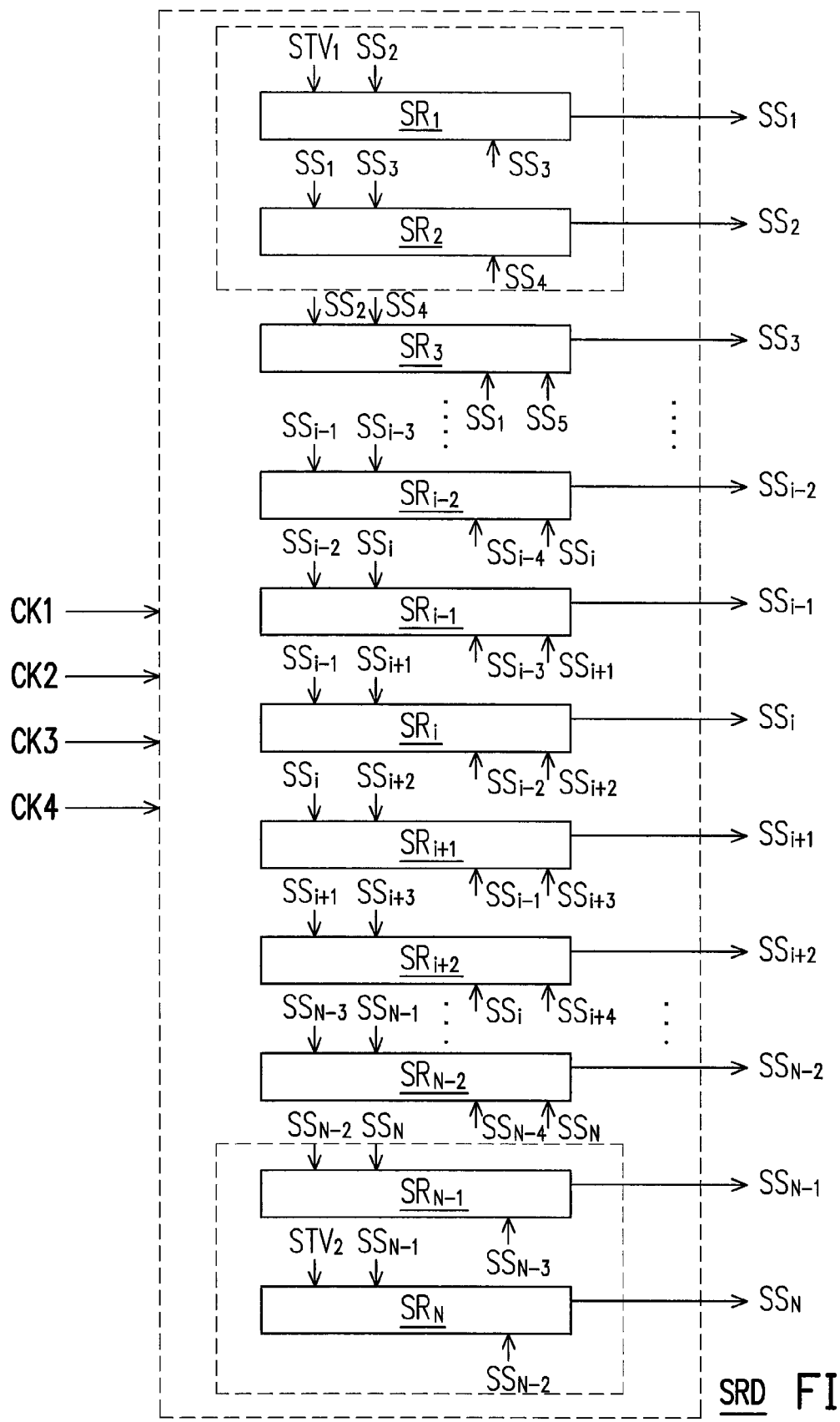
FIG. 2 is a block chart of a shift register device SRD according to an exemplary embodiment of the invention.

For more clarity, it can refer to FIGS. 1 and 2, in which FIG. 2 is a block chart of the shift register device SRD of FIG. 1. The bidirectional shift register device SRD includes N stages of shift registers $SR_1$-$SR_N$ in which the circuit architectures/configurations of the N stages are substantially the same and the shift registers $SR_1$-$SR_N$ are connected in series. In the exemplary embodiment, since the circuit architectures and the operation principles of the shift registers $SR_1$-$SR_N$ are substantially the same, thus in the following the description is done only on the i-th stage shift register $SR_i$ only ($3 \le i \le N-2$).

It should be noted that although the circuit architectures/configurations of the shift registers of the $1^{st}$ stage, $2^{nd}$ stage, (N-1)th stage and N-th stage, i.e., $SR_1$, $SR_2$, $SR_{N-1}$ and $SR_N$ are the same as that of the i-th stage shift register $SR_i$ ($3 \le i \le N-2$), but they are dummy shift registers. In other words, the scan signals $SS_1$, $SS_2$, $SS_{N-1}$ and $SS_N$ respectively output by the shift registers of the $1^{st}$ stage, $2^{nd}$ stage, (N-1)th stage and N-th stage, i.e., $SR_1$, $SR_2$, $SR_{N-1}$ and $SR_N$ are not for turning on any one of the pixel rows in the display area AA. Instead, the four scan signals $SS_1$, $SS_2$, $SS_{N-1}$ and $SS_N$ are used to maintain the normal operation of the bidirectional shift register device SRD only. Therefore, the scan signals $SS_1$, $SS_2$, $SS_{N-1}$ and $SS_N$ respectively output by the shift registers of the $1^{st}$ stage, $2^{nd}$ stage, (N-1)th stage and N-th stage, i.e., $SR_1$, $SR_2$, $SR_{N-1}$ and $SR_N$ are considered as dummy scan signals.

Figure 3A:
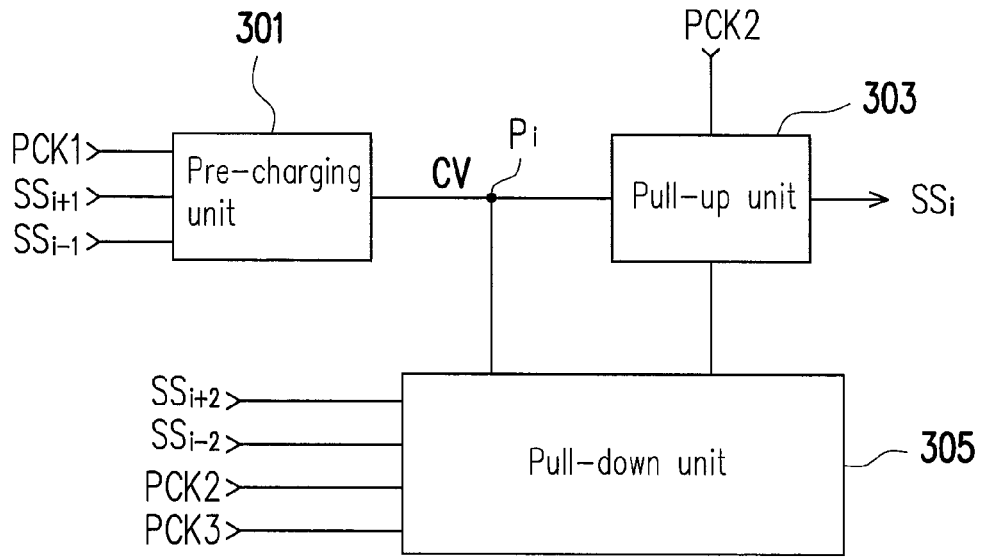
FIG. 3A is a block chart of an i-th stage shift register $SR_i$ according to an exemplary embodiment of the invention.
Figure 3B:
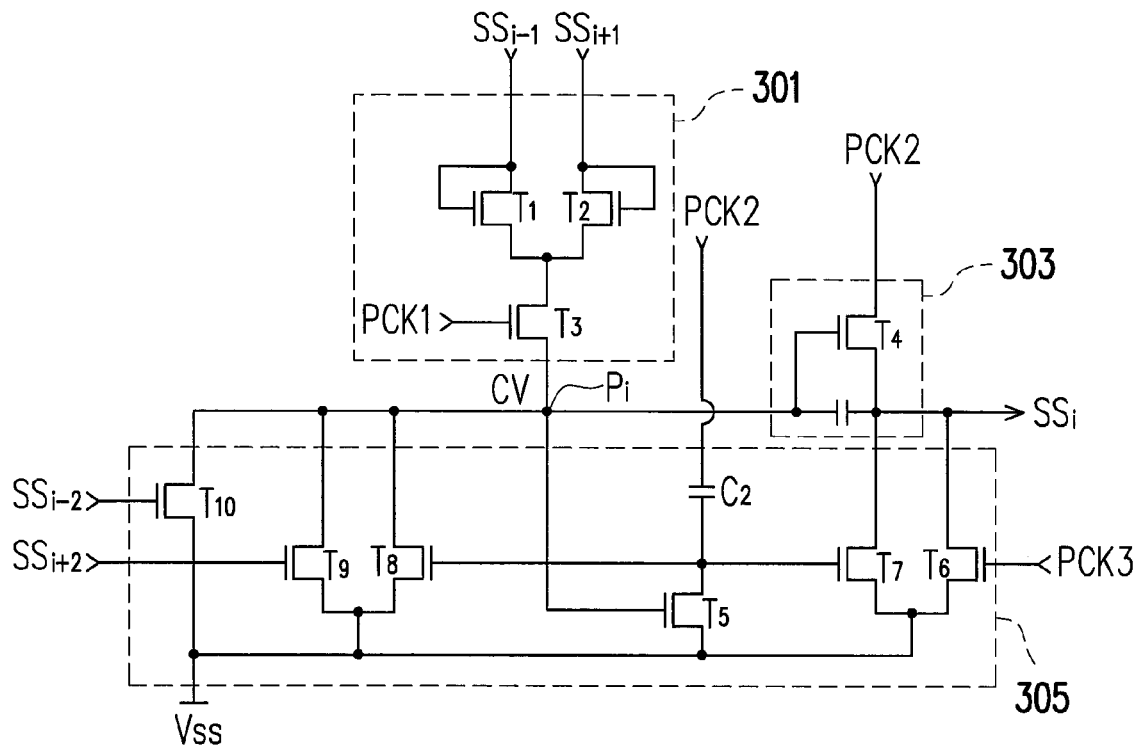
FIG. 3B is a schematic circuit diagram of an i-th stage shift register $SR_i$ according to an exemplary embodiment of the invention.

FIG. 3A is a block chart of the i-th stage shift register $SR_i$ in FIG. 2, and FIG. 3B is a schematic circuit diagram of the i-th stage shift register $SR_i$ in FIG. 3A, which are designed based on the above-mentioned consideration. Referring to FIGS. 1-3B, the i-th stage shift register $SR_i$ includes a pre-charging unit 301, a pull-up unit 303 and a pull-down unit 305. Under the condition of forward scanning performed by the shift register device SRD on the display area AA, the pre-charging unit 301 receives the first preset clock signal PCK1 provided by the T-con 105 and the scan signal $SS_{i-1}$ output from the (i-1)th stage shift register $SR_{i-1}$ so as to thereby output a charging signal CV. It should be noted that except the pre-charging unit 301 in the $1^{st}$ stage shift register $SR_1$ receives a starting signal $STV_1$ provided by the T-con 105, the pre-charging units 301 of the rest shift registers $SR_i$ (i=2 ... N) are in charge of receiving the scan signal $SS_{i-1}$ output from the last stage shift register $SR_{i-1}$.

For example, under the condition of forward scanning performed by the shift register device SRD on the display area AA, the pre-charging unit 301 in the $2^{nd}$ stage shift register $SR_2$ is in charge of receiving the scan signal $SS_1$ output from the $1^{st}$ stage shift register $SR_1$; the pre-charging unit 301 in the $3^{rd}$ stage shift register $SR_3$ is in charge of receiving the scan signal $SS_2$ output from the second stage shift register $SR_2$, and analogically for the rest until the N-th stage shift register $SR_N$ in which the pre-charging unit 301 is in charge of receiving the scan signal $SS_{N-1}$ output from the (N-1)th stage shift register $SR_{N-1}$.

Under the condition of reverse scanning performed by the shift register device SRD on the display area AA, the pre-charging unit 301 receives the first preset clock signal PCK1 provided by the T-con 105 and the scan signal $SS_{i+1}$ output from the (i+1)th stage shift register $SR_{i+1}$ so as to thereby output the charging signal CV. It should be noted that except the pre-charging unit 301 in the N-th stage shift register $SR_N$ receives a starting signal $STV_2$ provided by the T-con 105, the pre-charging units 301 of the rest shift registers $SR_i$ (i=1 ... N-1) are in charge of receiving the scan signal $SS_{i+1}$ output from the next stage shift register $SR_{i+1}$.

For example, under the condition of reverse scanning performed by the shift register device SRD on the display area AA, the pre-charging unit 301 in the (N-1)th stage shift register $SR_{N-1}$ is in charge of receiving the scan signal $SS_N$ output from the N-th stage shift register $SR_N$; the pre-charging unit 301 in the (N-2)th stage shift register $SR_{N-2}$ is in charge of receiving the scan signal $SS_{N-1}$ output from the (N-1)th stage shift register $SR_{N-1}$, and analogically for the rest until the $1^{st}$ stage shift register $SR_1$ in which the pre-charging unit 301 is in charge of receiving the scan signal $SS_2$ output from the second stage shift register $SR_2$.

In addition, the pull-up unit 303 is coupled to the pre-charging unit 301, and configured for receiving the charging signal CV output from the pre-charging unit 301 and the second preset clock signal PCK2 provided by the T-con 105 so as to thereby output the scan signal $SS_i$. While the pull-down unit 305 is coupled to the pre-charging unit 301 and the pull-up unit 303, and configured for receiving the second preset clock signal PCK2 and the third preset clock signal PCK3 both provided by the T-con 105 and the output from the (i+2)th stage shift register $SR_{i+2}$ or the (i−2)th stage shift register $SR_{i-2}$ (i.e., the scan signal $SS_{i+2}$ or $SS_{i-2}$) so as to thereby decide whether or not pulling down the scan signal $SS_i$ to the reference level Vss (for example, a negative voltage, which the invention is not limited to)

In more details, under the condition of forward scanning performed by the shift register device SRD on the display area AA, the pull-down unit 305 receives the second preset clock signal PCK2 and the third preset clock signal PCK3 both provided by the T-con 105 and the scan signal $SS_{i+2}$ output from the (i+2)th stage shift register $SR_{i+2}$ so as to thereby decide whether or not pulling down the scan signal SS; to the reference level Vss.

On the other hand, under the condition of reverse scanning performed by the shift register device SRD on the display area AA, the pull-down unit 305 receives the second preset clock signal PCK2 and the third preset clock signal PCK3 both provided by the T-con 105 and the scan signal $SS_{i-2}$ output from the (i−2)th stage shift register $SR_{i-2}$ so as to thereby decide whether or not pulling down the scan signal SS; to the reference level Vss.

It can be seen from FIG. 2 that the first-stage shift register $SR_1$ and the second-stage shift register $SR_2$ don't have the outputs of the last two stages shift registers thereof. Meanwhile, the (N−1)th shift register $SR_{N-1}$ and the N-th shift register $SR_N$ have also no outputs of the next two stages shift registers thereof and all the rest i-th stage shift registers $SR_i$ (i=3 until N−2) have the outputs of the last (i+2)th and (i−2)th stages shift registers $SR_{i+2}$ and $SR_{i-2}$. In this case, the $1^{st}$, $2^{nd}$, (N−1)th and N-th shift registers $SR_1$, $SR_2$, $SR_{N-1}$ and $SR_N$ function as dummy shift registers and at the time the corresponding outputs thereof are for maintaining the required normal operation of the bidirectional shift register device SRD.

In the exemplary embodiment, the pre-charging unit 301 includes N-type transistors T1-T3, in which the gate and the drain of the N-type transistor T1 are coupled to each other to receive the scan signal $SS_{i-1}$ of the (i−1)th stage shift register $SR_{i-1}$, and the gate and the drain of the N-type transistor T2 are coupled to each other to receive the scan signal $SS_{i+1}$ of the (i+1)th stage shift register $SR_{i+1}$. The drain of the N-type transistor T3 is coupled to the sources of the N-type transistors T1 and T2, the gate of the N-type transistor T3 receives the first preset clock signal PCK1 provided by the T-con 105, and the source of the N-type transistor T3 is for outputting the charging signal CV.

The pull-up unit 303 includes an N-type transistor T4 and a capacitor C1, in which the gate of the N-type transistor T4 is coupled to the source of the N-type transistor T3, the drain of the N-type transistor T4 receives the second preset clock signal PCK2 provided by the T-con 105, the source of the N-type transistor T4 is for outputting the scan signal $SS_i$. The capacitor C1 is coupled between the gate and the source of the N-type transistor T4.

The pull-down unit 305 includes N-type transistors T4-T10 and a capacitor C2, in which the first terminal of the capacitor C12 receives the second preset clock signal PCK2 provided by the T-con 105. The drain of the N-type transistor T5 is coupled to the second terminal of the capacitor C2, the gate of the N-type transistor T5 is coupled to the source of the N-type transistor T3, and the source of the N-type transistor T5 is coupled to the reference level Vss. The drain of the N-type transistor T6 is coupled to the source of the N-type transistor T4, the gate of the N-type transistor T6 receives the third preset clock signal PCK3 provided by the T-con 105, and the source of the N-type transistor T6 is coupled to the reference level Vss.

The drain of the N-type transistor T7 is coupled to the source of the N-type transistor T4, the gate of the N-type transistor T7 is coupled to the drain of the N-type transistor T5, and the source of the N-type transistor T7 is coupled to the reference level Vss. The drain of the N-type transistor T8 is coupled to the source of the N-type transistor T3, the gate of the N-type transistor T8 is coupled to the drain of the N-type transistor T5, and the source of the N-type transistor T8 is coupled to the reference level Vss. The drain of the N-type transistor T9 is coupled to the source of the N-type transistor T3, the gate of the N-type transistor T9 receives the scan signal $SS_{i+2}$ output from the (i+2)th stage shift register $SR_{i+2}$, and the source of the N-type transistor T9 is coupled to the reference level Vss. The drain of the N-type transistor T10 is coupled to the source of the N-type transistor T3, the gate of the N-type transistor T10 receives the scan signal $SS_{i-2}$ output from the (i−2)th stage shift register $SR_{i-2}$, and the source of the N-type transistor T10 is coupled to the reference level Vss.

Based on the description above, under the condition of forward scanning performed by the shift register device SRD on the display area AA, taking the $1^{st}$ stage shift register $SR_1$ (i=1) as an example, the first preset clock signal PCK1 received by the pre-charging unit 301 is the clock signal CK2, the second preset clock signal PCK2 received by the pull-up unit 303 is the clock signal CK3, and the second and third preset clock signals PCK2 and PCK3 received by the pull-down unit 305 are respectively the clock signals CK3 and CK1.

Under the condition of forward scanning performed by the shift register device SRD on the display area AA, taking the $2^{nd}$ stage shift register $SR_2$ (i=2) as an example, the first preset clock signal PCK1 received by the pre-charging unit 301 is the clock signal CK3, the second preset clock signal PCK2 received by the pull-up unit 303 is the clock signal CK4, and the second and third preset clock signals PCK2 and PCK3 received by the pull-down unit 305 are respectively the clock signals CK4 and CK2.

Under the condition of forward scanning performed by the shift register device SRD on the display area AA, taking the $3^{rd}$ stage shift register $SR_3$ (i=3) as an example, the first preset clock signal PCK1 received by the pre-charging unit 301 is the clock signal CK4, the second preset clock signal PCK2 received by the pull-up unit 303 is the clock signal CK1, and the second and third preset clock signals PCK2 and PCK3 received by the pull-down unit 305 are respectively the clock signals CK1 and CK3.

Under the condition of forward scanning performed by the shift register device SRD on the display area AA, taking the $4^{th}$ stage shift register $SR_4$ (i=4) as an example, the first preset clock signal PCK1 received by the pre-charging unit 301 is the clock signal CK1, the second preset clock signal PCK2 received by the pull-up unit 303 is the clock signal CK2, and the second and third preset clock signals PCK2 and PCK3 received by the pull-down unit 305 are respectively the clock signals CK2 and CK4.

Under the condition of forward scanning performed by the shift register device SRD on the display area AA, taking the $5^{th}$ stage shift register $SR_5$ (i=5) as an example, the first preset clock signal PCK1 received by the pre-charging unit 301 is the clock signal CK2, the second preset clock signal PCK2 received by the pull-up unit 303 is the clock signal CK3, and the second and third preset clock signals PCK2 and PCK3 received by the pull-down unit 305 are respectively the clock signals CK3 and CK1.

Under the condition of forward scanning performed by the shift register device SRD on the display area AA, taking the $6^{th}$ stage shift register $SR_6$ (i=6) as an example, the first preset clock signal PCK1 received by the pre-charging unit 301 is the clock signal CK3, the second preset clock signal PCK2 received by the pull-up unit 303 is the clock signal CK4, and the second and third preset clock signals PCK2 and PCK3 received by the pull-down unit 305 are respectively the clock signals CK4 and CK2.

Under the condition of forward scanning performed by the shift register device SRD on the display area AA, taking the $7^{th}$ stage shift register $SR_7$ (i=7) as an example, the first preset clock signal PCK1 received by the pre-charging unit 301 is the clock signal CK4, the second preset clock signal PCK2 received by the pull-up unit 303 is the clock signal CK1, and the second and third preset clock signals PCK2 and PCK3 received by the pull-down unit 305 are respectively the clock signals CK1 and CK3.

Under the condition of forward scanning performed by the shift register device SRD on the display area AA, taking the $8^{th}$ stage shift register $SR_8$ (i=8) as an example, the first preset clock signal PCK1 received by the pre-charging unit 301 is the clock signal CK1, the second preset clock signal PCK2 received by the pull-up unit 303 is the clock signal CK2, and the second and third preset clock signals PCK2 and PCK3 received by the pull-down unit 305 are respectively the clock signals CK2 and CK4.

It can be seen that under the condition of forward scanning performed by the shift register device SRD on the display area AA, every four adjacent shift registers from up to down can be considered as a same group (for example, $SR_{1-4}$, $SR_{5-8}$, ..., $SR_{(N-3)-N}$). The four first preset clock signals PCK1 respectively received by the gates of the N-type transistors T3 of the adjacent four shift registers belonging to the same group ($SR_{1-4}$, $SR_{5-8}$, ..., $SR_{(N-3)-N}$) are sequentially clock signals CK2→CK3→CK4→CK1; the four second preset clock signals PCK2 respectively received by the drains of the N-type transistors T4 of the adjacent four shift registers belonging to the same group ($SR_{1-4}$, $SR_{5-8}$, ..., $SR_{(N-3)-N}$) are sequentially clock signals CK3→CK4→CK1→CK2; the four second preset clock signals PCK2 respectively received by the first terminals of the capacitors C2 of the adjacent four shift registers belonging to the same group ($SR_{1-4}$, $SR_{5-8}$, ..., $SR_{(N-3)-N}$) are sequentially clock signals CK3→CK4→CK1→CK2; and the four third preset clock signals PCK3 respectively received by the gates of the N-type transistors T6 of the adjacent four shift registers belonging to the same group ($SR_{1-4}$, $SR_{5-8}$, ..., $SR_{(N-3)-N}$) are sequentially clock signals CK1→CK2→CK3→CK4.

On the other hand, under the condition of reverse scanning performed by the shift register device SRD on the display area AA, taking the N-th stage shift register $SR_1$ (i=N) as an example, the first preset clock signal PCK1 received by the pre-charging unit 301 is the clock signal CK2, the second preset clock signal PCK2 received by the pull-up unit 303 is the clock signal CK3, and the second and third preset clock signals PCK2 and PCK3 received by the pull-down unit 305 are respectively the clock signals CK3 and CK1.

Under the condition of reverse scanning performed by the shift register device SRD on the display area AA, taking the (N−1)th stage shift register $SR_i$ (i=N−1) as an example, the first preset clock signal PCK1 received by the pre-charging unit 301 is the clock signal CK3, the second preset clock signal PCK2 received by the pull-up unit 303 is the clock signal CK4, and the second and third preset clock signals PCK2 and PCK3 received by the pull-down unit 305 are respectively the clock signals CK4 and CK2.

Under the condition of reverse scanning performed by the shift register device SRD on the display area AA, taking the (N−2)th stage shift register $SR_i$ (i=N−2) as an example, the first preset clock signal PCK1 received by the pre-charging unit 301 is the clock signal CK4, the second preset clock signal PCK2 received by the pull-up unit 303 is the clock signal CK1, and the second and third preset clock signals PCK2 and PCK3 received by the pull-down unit 305 are respectively the clock signals CK1 and CK3.

Under the condition of reverse scanning performed by the shift register device SRD on the display area AA, taking the (N−3)th stage shift register $SR_i$ (i=N−3) as an example, the first preset clock signal PCK1 received by the pre-charging unit 301 is the clock signal CK1, the second preset clock signal PCK2 received by the pull-up unit 303 is the clock signal CK2, and the second and third preset clock signals PCK2 and PCK3 received by the pull-down unit 305 are respectively the clock signals CK2 and CK4.

Under the condition of reverse scanning performed by the shift register device SRD on the display area AA, taking the (N−4)th stage shift register $SR_i$ (i=N−4) as an example, the first preset clock signal PCK1 received by the pre-charging unit 301 is the clock signal CK2, the second preset clock signal PCK2 received by the pull-up unit 303 is the clock signal CK3, and the second and third preset clock signals PCK2 and PCK3 received by the pull-down unit 305 are respectively the clock signals CK3 and CK1.

Under the condition of reverse scanning performed by the shift register device SRD on the display area AA, taking the (N−5)th stage shift register $SR_i$ (i=N−5) as an example, the first preset clock signal PCK1 received by the pre-charging unit 301 is the clock signal CK3, the second preset clock signal PCK2 received by the pull-up unit 303 is the clock signal CK4, and the second and third preset clock signals PCK2 and PCK3 received by the pull-down unit 305 are respectively the clock signals CK4 and CK2.

Under the condition of reverse scanning performed by the shift register device SRD on the display area AA, taking the (N−6)th stage shift register $SR_i$ (i=N−6) as an example, the first preset clock signal PCK1 received by the pre-charging unit 301 is the clock signal CK4, the second preset clock signal PCK2 received by the pull-up unit 303 is the clock signal CK1, and the second and third preset clock signals PCK2 and PCK3 received by the pull-down unit 305 are respectively the clock signals CK1 and CK3.

Under the condition of reverse scanning performed by the shift register device SRD on the display area AA, taking the (N−7)th stage shift register $SR_i$ (i=N−7) as an example, the first preset clock signal PCK1 received by the pre-charging unit 301 is the clock signal CK1, the second preset clock signal PCK2 received by the pull-up unit 303 is the clock signal CK2, and the second and third preset clock signals PCK2 and PCK3 received by the pull-down unit 305 are respectively the clock signals CK2 and CK4.

It can be seen that under the condition of reverse scanning performed by the shift register device SRD on the display area AA, every four adjacent shift registers from down to up can be considered as a same group (for example, $SR_{N-(N-3)}$, $SR_{(N-4)-(N-7)}$, ..., $SR_{4-1}$). The four first preset clock signals PCK1 respectively received by the gates of the N-type transistors T3 of the adjacent four shift registers belonging to the same group ($SR_{N-(N-3)}$, $SR_{(N-4)-(N-7)}$, ..., $SR_{4-1}$) are sequentially clock signals CK2→CK3→CK4→CK1; the four second preset clock signals PCK2 respectively received by the drains of the N-type transistors T4 of the adjacent four shift registers belonging to the same group ($SR_{N-(N-3)}$, $SR_{(N-4)-(N-7)}$, ..., $SR_{4-1}$) are sequentially clock signals CK3→CK4→CK1→CK2; the four second preset clock signals PCK2 respectively received by the first terminals of the capacitors C2 of the adjacent four shift registers belonging to the same group ($SR_{N-(N-3)}$, $SR_{(N-1)-(N-7)}$, $SR_{4-1}$) are sequentially clock signals CK3→CK4→CK1→CK2; and the four third preset clock signals PCK3 respectively received by the gates of the N-type transistors T6 of the adjacent four shift registers belonging to the same group ($SR_{N-(N-3)}$, $SR_{(N-4)-(N-7)}$, . . . , $SR_{4-1}$) are sequentially clock signals CK1→CK2→CK3→CK4.

Figure 4:
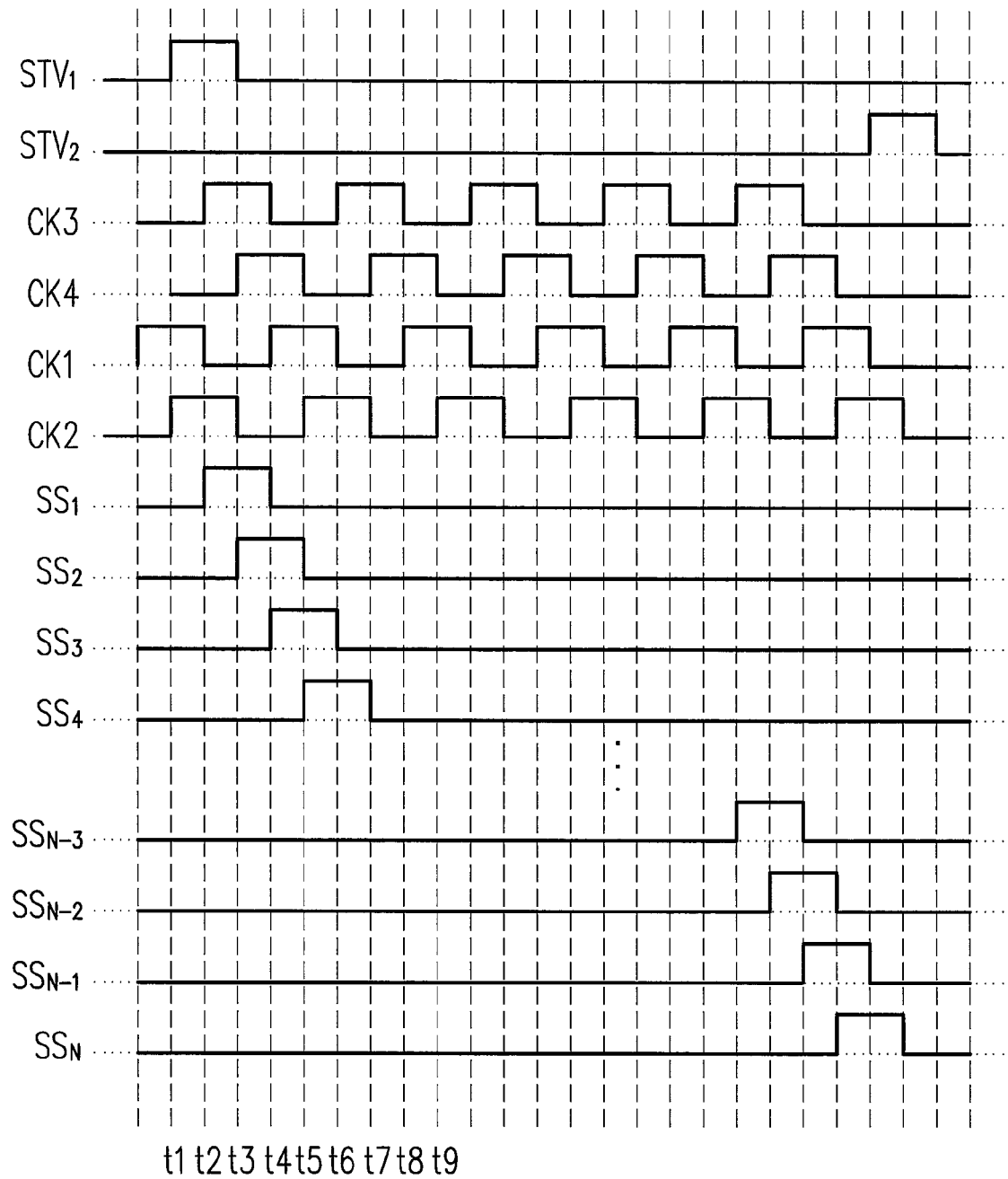
FIG. 4 is an operation timing diagram of the bidirectional shift register device according to an exemplary embodiment of the invention.

FIG. 4 is an operation waveform diagram for the shift register device SRD of FIG. 2 to perform the forward scanning on the display area AA. The operation principle of each of the stage shift registers $SR_1$-$SR_N$ can be more understood referring to FIGS. 2-4. In FIG. 4, it can be seen that the T-con 105 in series and periodically produces the clock signals CK3, CK4, CK1 and CK2 to the shift register device SRD, and the enabling time of the clock signals CK3, CK4, CK1 and CK2 produced in series and periodically are overlapped with each other, for example, the enabling time has 50% portion to be overlapped, which the invention is not limited to. In addition, the enabling time of the start signal $STV_1$ produced by the T-con 105 and the start enabling time of the clock signal CK3 have also 50% portions overlapped with each other, and the enabling time of the start signal $STV_2$ produced by the T-con 105 and the end enabling time of the clock signal CK2 have also 50% portions overlapped with each other.

Under the above-mentioned condition, taking the $1^{st}$-stage shift register $SR_1$ as an example, when the pre-charging unit 301 of the $1^{st}$-stage shift register $SR_1$ receives the starting signal $STV_1$ at the time t1 and the clock signal CK2 is enabled during the time t1-t2, the N-type transistors T1 and T3 would be turned on and pre-charge the node $P_1$ during the time t1-t2. Therefore, when the clock signal CK3 provided by the T-con 105 is enabled during the time t2-t3, the voltage on the node $P_1$, due to the affecting by the coupling effect of the clock signal CK3, is pulled up so as to turn on the NMOS transistor T4 of the pull-up unit 303 and further output the scan signal $SS_1$ of the $1^{st}$-stage shift register $SR_1$ during the time t2-t4.

Thereafter, after the pre-charging unit 301 and the pull-up unit 303 are in charge of outputting the scan signal $SS_1$, the N-type transistor T6 of the pull-down unit 305 is turned on due to enabling the clock signal CK1 provided by the T-con 105 at the time t4. In this way, the scan signal $SS_1$ is pulled down to the reference level Vss at the time t4.

In addition, when the $1^{st}$-stage shift register $SR_1$ has not received the starting signal $STV_1$, since the clock signal CK3 is still enabled periodically, which makes the node $P_1$ still produce a coupling signal during the time t6-t8. In order to avoid the scan signal $SS_1$ from being output, the coupling signal of the clock signal CK3 can be released to the reference level Vss. Thus, the N-type transistors T7 and T8 of the pull-down unit 305 are turned on during the time t6-t8 so as to pull down the scan signal $SS_1$ to the reference level Vss. As a result, the coupling signal caused by enabling the clock signal CK3 after the time t8 is released to the reference level Vss, and therefore, the coupling signal caused by clock signal CK3 after the time t8 is unable to affect the output of the scan signal $SS_1$.

Since the scan signal $SS_3$ output by the $3^{rd}$-stage shift register $SR_3$ would be fed back to the N-type transistor T9 of the pull-down unit 305 of the $1^{st}$-stage shift register $SR_1$, so that the N-type transistor T9 of the pull-down unit 305 of the $1^{st}$-stage shift register $SR_1$ is turned on to make discharge on the node $P_1$. It can be seen after the pre-charging unit 301 and the pull-up unit 303 are in charge of outputting the scan signal $SS_1$, the pull-down unit 305 enhances the capabilities of pulling down and the regulating thereof under the controls of the shift registers ($SR_1$ and $SR_3$) of the present stage and the stage after next (i.e. next two stage) and is in charge of terminating the output of the scan signal $SS_1$.

During the forward scanning of the $1^{st}$-stage shift register $SR_1$, since the circuit of the invention has reverse scanning function, the $1^{st}$-stage shift register $SR_1$ can receive the scan signal $SS_2$ of the second-stage shift register $SR_2$ at the time t3, which however does not affect the output of the $1^{st}$-stage shift register $SR_1$. In more details, after the first-stage shift register $SR_1$ outputs the scan signal $SS_1$ thereof, the scan signal $SS_2$ of the second-stage shift register $SR_2$ still is fed back to the N-type transistor T2 of the first-stage shift register $SR_1$. Since during feeding back the signal to the $1^{st}$-stage shift register $SR_1$, the clock signal CK2 is not enabled during the time t3-t5, the N-type transistor T3 is in off state so that the scan signal $SS_2$ of the second-stage shift register $SR_2$ does not affect the output of the first-stage shift register $SR_1$.

Although the above-mentioned exemplary embodiment focuses on the forward scanning through describing the operation principle of the $1^{st}$-stage shift register $SR_1$, but the rest shift registers are similar to the $1^{st}$-stage shift register $SR_1$, which is omitted to describe.

Following the above-mentioned regular configuration of the clock signals CK1-CK4 and the circuit explanation of the shift register $SR_1$, the bidirectional shift register device SRD can perform the forward scanning on all of pixel rows in the display area AA. After the T-con 105 sends the starting signal $STV_1$ to the $1^{st}$-stage shift register $SR_1$, the scan signal $SS_1$ is produced by the $1^{st}$-stage shift register $SR_1$ and output to the $2^{nd}$-stage shift register $SR_2$. After the $2^{nd}$-stage shift register $SR_2$ receives the scan signal $SS_1$ of the first-stage shift register $SR_1$, the $2^{nd}$-stage shift register $SR_2$ is started/activated and produces the scan signal $SS_2$ as described by the circuit operation corresponding to the shift register $SR_1$. People skilled in the art can understand the output way of every stage shift register by referring to the above-mentioned circuit operation.

When the T-con 105 sends the starting signal $STV_1$ to the pre-charging unit 301 of the $1^{st}$-stage shift register $SR_1$ and respectively provides the clock signals CK1-CK4 to all the shift registers $SR_1$-$SR_N$, the shift registers $SR_1$-$SR_N$ in the bidirectional shift register device SRD would output forwardly and in series the scan signals $SS_1$-$SS_N$ and sequentially turns on the pixel rows in the display area AA from the $1^{st}$ pixel row to the last pixel row through the scan signals $SS_3$-$SS_{N-2}$ among the scan signals $SS_1$-$SS_N$. At the time, the source driver 103 provides the corresponding display data to each of the pixel rows turned on by the bidirectional shift register device SRD. In association with the backlight source provided by the backlight module 107, the LCD panel 101 displays the image frames.

Figure 5:
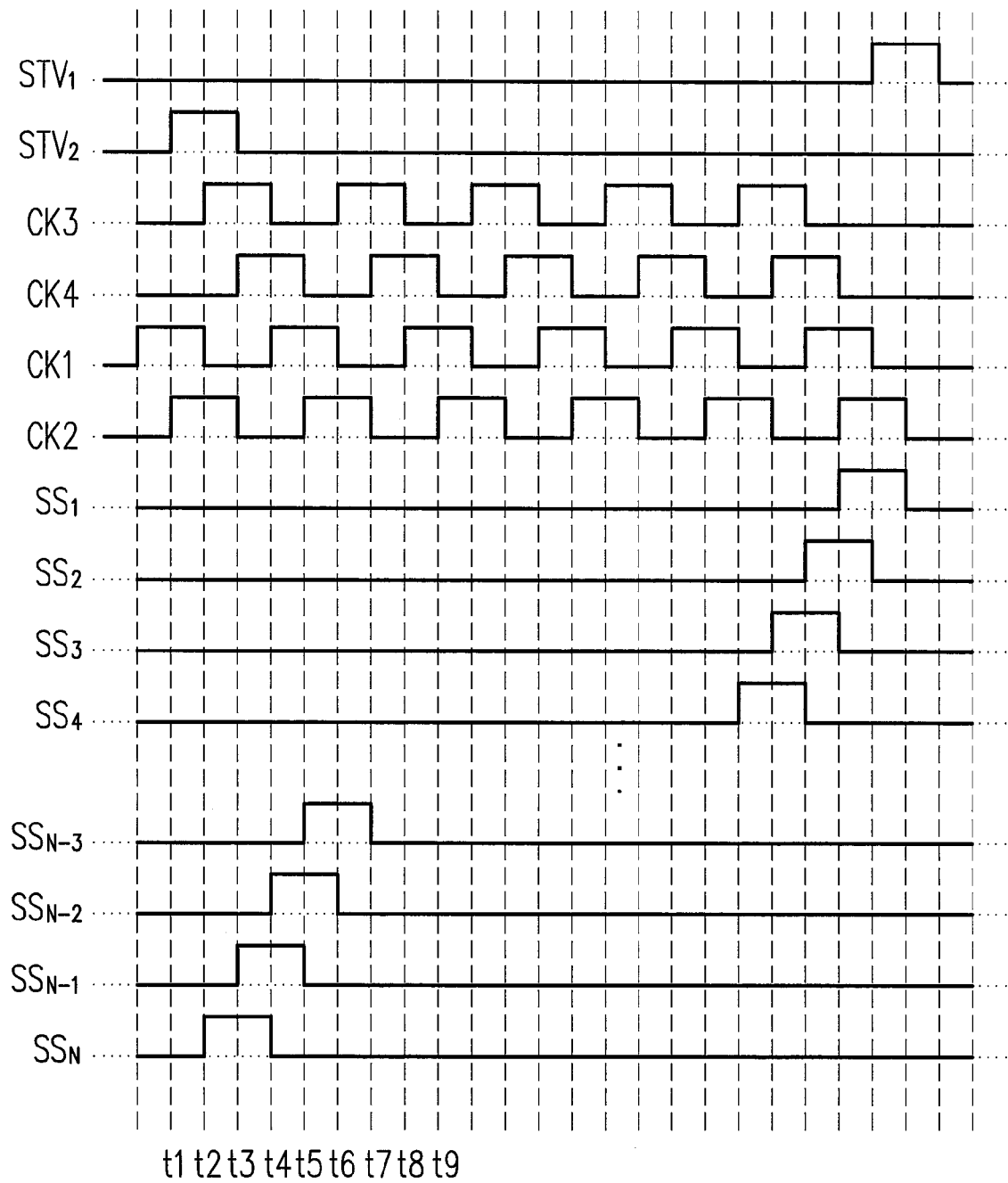
FIG. 5 is an operation timing diagram of the bidirectional shift register device according to another exemplary embodiment of the invention.

FIG. 5 is an operation waveform diagram for the shift register device SRD to perform the reverse scanning on the display area AA. Referring to FIGS. 2-5, it can be seen that the T-con 105 in series and periodically produces the clock signals CK3, CK4, CK1 and CK2 to the shift register device SRD, and the enabling time of the clock signals CK3, CK4, CK1 and CK2 produced in series are overlapped with each other, for example, the enabling time has 50% portion to be overlapped, which the invention is not limited to. In addition, the enabling time of the start signal $STV_2$ produced by the T-con 105 and the start enabling time of the clock signal CK3 have also 50% portions overlapped with each other, and the enabling time of the start signal $STV_1$ produced by the T-con 105 and the end enabling time of the clock signal CK2 have also 50% portions overlapped with each other.

Under the above-mentioned condition, taking the N-th stage shift register $SR_N$ as an example, when the pre-charging unit 301 of the N-th stage shift register $SR_N$ receives the starting signal $STV_2$ at the time t1 and the clock signal CK2 is enabled during the time t1-t2, the N-type transistors T1 and T3 would be turned on and pre-charge the node $P_N$ during the time t1-t2. Therefore, when the clock signal CK3 provided by the T-con 105 is enabled during the time t2-t3, the voltage on the node $P_N$, due to the affecting by the coupling effect of the clock signal CK3, is pulled up so as to turn on the N-type transistor T4 of the pull-up unit 303 and further output the scan signal $SS_N$ of the N-th stage shift register $SR_N$ during the time t2-t4.

Thereafter, after the pre-charging unit 301 and the pull-up unit 303 are in charge of outputting the scan signal $SS_1$, the N-type transistor T6 of the pull-down unit 305 is turned on due to enabling the clock signal CK1 provided by the T-con 105 at the time t4. In this way, the scan signal $SS_N$ is pulled down to the reference level Vss at the time t4.

In addition, when the N-th stage shift register $SR_N$ has not received the starting signal $STV_2$, since the clock signal CK3 is still enabled periodically, which makes the node $P_N$ still produce a coupling signal during the time t6-t8. In order to avoid the scan signal $SS_N$ from being output, the coupling signal of the clock signal CK3 can be released to the reference level Vss. Thus, the N-type transistors T7 and T8 of the pull-down unit 305 are turned on during the time t6-t8 so as to pull down the scan signal $SS_N$ to the reference level Vss. As a result, the coupling signal caused by enabling the clock signal CK3 after the time t8 is released to the reference level Vss, and therefore, the coupling signal caused by clock signal CK3 after the time t8 is unable to affect the output of the scan signal $SS_N$.

Since the scan signal $SS_{N-2}$ output by the (N-2)th stage shift register $SR_{N-2}$ would be fed back to the N-type transistor T9 of the pull-down unit 305 of the N-th stage shift register $SR_N$, so that the NMOS transistor T9 of the pull-down unit 305 of the N-th stage shift register $SR_N$ is turned on to make discharge on the node $P_N$. It can be seen that after the pre-charging unit 301 and the pull-up unit 303 are in charge of outputting the scan signal $SS_N$, the pull-down unit 305 enhances the capabilities of pulling down and the regulating thereof under the controls of the shift registers ($SR_N$ and $SR_{N-2}$) of the present stage and the stage after next (i.e. the last two stage) and is in charge of terminating the output of the scan signal $SS_N$.

Similarly, during the reverse scanning of the N-th stage shift register $SR_N$, since the circuit of the invention has forward scanning function, the N-th stage shift register $SR_N$ can receive the scan signal $SS_{N-1}$ of the (N-1)th stage shift register $SR_{N-1}$ at the time t3, which however does not affect the output of the N-th stage shift register $SR_N$. In more details, after the N-th stage shift register $SR_N$ outputs the scan signal $SS_N$ thereof, the scan signal $SS_{N-1}$ of the (N-1)th stage shift register $SR_{N-1}$ still is fed back to the N-type transistor T1 of the N-th stage shift register $SR_N$. Since during feeding back the signal to the N-th stage shift register $SR_N$, the clock signal CK2 is not enabled during the time t3-t5, the N-type transistor T3 is in off state so that the scan signal $SS_{N-1}$ of the (N-1)th stage shift register $SR_{N-1}$ does not affect the output of the N-th stage shift register $SR_N$.

Although the above-mentioned exemplary embodiment focuses on the reverse scanning through describing the operation principle of the N-th stage shift register $SR_N$, but the rest shift registers are similar to the N-th stage shift register $SR_N$, which is omitted to describe.

Following the above-mentioned regular configuration of the clock signals CK1-CK4 and the circuit explanation of the shift register $SR_N$, the bidirectional shift register device SRD can perform the reverse scanning on all of pixel rows in the display area AA. After the T-con 105 sends the starting signal $STV_2$ to the N-th stage shift register $SR_N$, the scan signal $SS_N$ is produced by the N-th stage shift register $SR_N$ and output to the (N-1)th stage shift register $SR_{N-1}$. After the (N-1)th stage shift register $SR_{N-1}$ receives the scan signal $SS_N$ of the N-th stage shift register $SR_N$, the (N-1)th stage shift register $SR_{N-1}$ is started/activated and produces the scan signal $SS_{N-1}$ as described by the circuit operation corresponding to the shift register $SR_N$. People skilled in the art can understand the output way of every stage shift register by referring to the above-mentioned circuit operation.

When the T-con 105 sends the starting signal $STV_2$ to the pre-charging unit 301 of the N-th stage shift register $SR_N$ and respectively provides the clock signals CK1-CK4 to all the shift registers $SR_N$-$SR_1$, the shift registers $SR_N$-$SR_1$ in the bidirectional shift register device SRD would output reversely and in series the scan signals $SS_N$-$SS_1$ and sequentially turns on the pixel rows in the display area AA from the last pixel row to the $1^{st}$ pixel row through the scan signals $SS_{N-2}$-$SS_3$ among the scan signals $SS_N$-$SS_1$. At the time, the source driver 103 provides the corresponding display data to each of the pixel rows turned on by the bidirectional shift register device SRD. In association with the backlight source provided by the backlight module 107, the LCD panel 101 displays the image frames.

In summary, the main scheme of the invention is directly disposing a bidirectional shift register device on the substrate of the panel and controlling the operation of the bidirectional shift register device through the T-con so that the bidirectional shift register device can forwardly and in series output a scan signal to turn on the pixel rows in the display panel from the $1^{st}$ pixel row to the last pixel row, or reversely and in series output a scan signal to turn on the pixel rows in the display panel from the last pixel row to the $1^{st}$ pixel row. In this way, the bidirectional shift register device performs the forward scanning or reverse scanning on the display panel.

In other words, the bidirectional shift register device of the invention has the reverse scanning function through circuit layout and timing configuration, which the difficulty in the prior art that most of the multi-stages shift registers directly disposed on the LCD panel do not have the reverse scanning function. The invention can simplify the huge circuit in the prior art to reach the reverse scanning goal and avoid the parasitic capacitance effect produced by the huge circuit and moreover save the production cost due to directly disposing the shift registers on the LCD panel.

In addition, if the process technology factor is allowed, every-stage shift register of the above-mentioned exemplary embodiment can be implemented by P-type transistors and such modified exemplary embodiment belongs to the claim scope of the invention as well.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A bidirectional shift register device, comprising:
N stages shift registers in series connection, wherein i-th stage shift register comprises:
a pre-charging unit, receiving a first preset clock signal and output from a (i−1)th stage shift register or a (i+1)th stage shift register so as to thereby output a charging signal;
a pull-up unit, coupled to the pre-charging unit, and receiving the charging signal and a second preset clock signal so as to thereby output a scan signal;
a pull-down unit, coupled to the pre-charging unit and the pull-up unit, and receiving the second preset clock signal, a third preset clock signal and output from a (i+2)th stage shift register or a (i−2)th stage shift register so as to decide whether or not pulling down the scan signal to a reference level,
wherein N is a preset positive integer and i is a positive integer greater than or equal to 3 but less than or equal to N−2,
wherein the pre-charging unit of the i-th stage shift register comprises:
a first transistor, having a gate and a drain coupled to each other to receive the output from the (i−1)th stage shift register;
a second transistor, having a gate and a drain coupled to each other to receive the output from the (i+1)th stage shift register; and
a third transistor, having a drain coupled to sources of the first transistor and the second transistor, a gate receiving the first preset clock signal, and a source outputting the charging signal.

2. The bidirectional shift register device as claimed in claim 1, wherein the pull-up unit of the i-th stage shift register comprises:
a fourth transistor, having a drain receiving the second preset clock signal, a gate coupled to the source of the third transistor, and a source outputting the scan signal; and
a first capacitor, coupled between the gate and the source of the fourth transistor.

3. The bidirectional shift register device as claimed in claim 2, wherein the pull-down unit of the i-th stage shift register comprises:
a second capacitor, having a first terminal receiving the second preset clock signal;
a fifth transistor, having a drain coupled to a second terminal of the second capacitor, a gate coupled to the source of the third transistor, and a source coupled to the reference level;
a sixth transistor, having a drain coupled to the source of the fourth transistor, a gate receiving the third preset clock signal, and a source coupled to the reference level;
a seventh transistor, having a drain coupled to the source of the fourth transistor, a gate coupled to the drain of the fifth transistor, and a source coupled to the reference level;
an eighth transistor, having a drain coupled to the source of the third transistor, a gate coupled to the drain of the fifth transistor, and a source coupled to the reference level;
a ninth transistor, having a drain coupled to the source of the third transistor, a gate receiving the output from the (i+2)th stage shift register, and a source coupled to the reference level; and
a tenth transistor, having a drain coupled to the source of the third transistor, a gate coupled to the output from the (i−2)th stage shift register, and a source coupled to the reference level.

4. The bidirectional shift register device as claimed in claim 3, wherein the first through tenth transistors are N-type transistors.

5. The bidirectional shift register device as claimed in claim 3, wherein enabling time of the first through third preset clock signals are overlapped with each other.

6. The bidirectional shift register device as claimed in claim 3, wherein circuit configurations of the $1^{st}$ stage, $2^{nd}$ stage, (N−1)th stage and N-th stage shift registers are the same as that of the i-th stage shift register and all are dummy shift registers.

7. A liquid crystal display, comprising:
a liquid crystal display panel, comprising a substrate and a bidirectional shift register device, wherein the bidirectional shift register device is directly disposed on the substrate and has a plurality stages of shift registers in series connection, wherein i-th stage shift register comprises:
a pre-charging unit, receiving a first preset clock signal and output from a (i−1)th stage shift register or a (i+1)th stage shift register so as to thereby output a charging signal;
a pull-up unit, coupled to the pre-charging unit and receiving the charging signal and a second preset clock signal so as to thereby output a scan signal;
a pull-down unit, coupled to the pre-charging unit and the pull-up unit and receiving the second preset clock signal, a third preset clock signal and output from a (i+2)th stage shift register or a (i−2)th stage shift register so as to decide whether or not pulling down the scan signal to a reference level, wherein N is a preset positive integer and i is a positive integer greater than or equal to 3 but less than or equal to N−2; and
a backlight module, providing the liquid crystal display panel with required light source,
wherein the pre-charging unit of the i-th stage shift register comprises:
a first transistor, having a gate and a drain coupled to each other to receive the output from the (i−1)th stage shift register;
a second transistor, having a gate and a drain coupled to each other to receive the output from the (i+1)th stage shift register; and
a third transistor, having a drain coupled to sources of the first transistor and the second transistor, a gate receiving the first preset clock signal, and a source outputting the charging signal.

8. The liquid crystal display as claimed in claim 7, wherein the pull-up unit of the i-th stage shift register comprises:
a fourth transistor, having a drain receiving the second preset clock signal, a gate coupled to the source of the third transistor and a source outputting the scan signal; and
a first capacitor, coupled between the gate and the source of the fourth transistor.

9. The liquid crystal display as claimed in claim 8, wherein the pull-down unit of the i-th stage shift register comprises:
a second capacitor, having a first terminal receiving the second preset clock signal;

a fifth transistor, having a drain coupled to a second terminal of the second capacitor, a gate coupled to the source of the third transistor, and a source coupled to the reference level;

a sixth transistor, having a drain coupled to the source of the fourth transistor, a gate receiving the third preset clock signal, and a source coupled to the reference level;

a seventh transistor, having a drain coupled to the source of the fourth transistor, a gate coupled to the drain of the fifth transistor, and a source coupled to the reference level;

an eighth transistor, having a drain coupled to the source of the third transistor, a gate coupled to the drain of the fifth transistor, and a source coupled to the reference level;

a ninth transistor, having a drain coupled to the source of the third transistor, a gate receiving the output from the (i+2)th stage shift register, and a source coupled to the reference level; and a tenth transistor, having a drain coupled to the source of the third transistor, a gate coupled to the output from the (i−2)th stage shift register, and a source coupled to the reference level.

10. The liquid crystal display as claimed in claim 9, wherein the first through tenth transistors are N-type transistors.

11. The liquid crystal display as claimed in claim 9, wherein enabling time of the first through third preset clock signals are overlapped with each other.

12. The liquid crystal display as claimed in claim 9, wherein circuit configurations of the $1^{st}$ stage, $2^{nd}$ stage, (N−1)th stage and N-th stage shift registers are the same as that of the i-th stage shift register and all are dummy shift registers.

\* \* \* \* \*